(12) United States Patent
Joyce et al.

(10) Patent No.: US 10,252,908 B2
(45) Date of Patent: *Apr. 9, 2019

(54) MEMBRANE BONDING WITH PHOTORESIST

(71) Applicant: UBEAM INC., Santa Monica, CA (US)

(72) Inventors: Andrew Joyce, Venice, CA (US); Sean Taffler, Pacific Palisades, CA (US); Paul Reynolds, Renton, WA (US); Nicholas Lavada Nemeth, Santa Monica, CA (US); Adam Stephen Elhadad, Santa Monica, CA (US); Boozarjomehr Faraji, Valencia, CA (US)

(73) Assignee: uBeam Inc., Marina Del Rey, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/902,570

(22) Filed: Feb. 22, 2018

(65) Prior Publication Data

US 2018/0179053 A1 Jun. 28, 2018

Related U.S. Application Data

(63) Continuation of application No. 15/154,900, filed on May 13, 2016, which is a continuation of application
(Continued)

(51) Int. Cl.
*B81C 1/00* (2006.01)
*G03F 7/00* (2006.01)
(Continued)

(52) U.S. Cl.
CPC ........ *B81C 1/00182* (2013.01); *F16B 11/006* (2013.01); *G03F 7/00* (2013.01);
(Continued)

(58) Field of Classification Search
USPC ........................ 156/249, 272.2, 307.1, 307.3
See application file for complete search history.

(56) References Cited

U.S. PATENT DOCUMENTS

| 4,204,096 A | 5/1980 | Barcus et al. |
| 5,396,143 A | 3/1995 | Seyed-Bolorforosh |

(Continued)

OTHER PUBLICATIONS

International Search Report and Written Opinion dated Aug. 16, 2016 as received in Application No. PCT/US2016/033371.
(Continued)

*Primary Examiner* — Sing P Chan
(74) *Attorney, Agent, or Firm* — Morris & Kamlay LLP

(57) ABSTRACT

Systems and techniques are provided for membrane bonding. A photoresist may be applied to an ultrasonic device. A portion of the photoresist may be removed. A bonding agent may be applied a portion of the photoresist that is not removed. A membrane may be placed on the ultrasonic device such that the membrane is in contact with the ultrasonic device through the bonding agent and the photoresist. The membrane and the ultrasonic device may be placed in between a first flat plate and a second flat plate, such that the second flat plate rests on top of the membrane. Light pressure may be applied to the membrane. The light pressure may be applied by one or more of the weight of the second flat plate and a pressure providing device applying pressure to either or both of the first flat plate and the second flat plate.

20 Claims, 12 Drawing Sheets

Related U.S. Application Data

No. 15/077,734, filed on Mar. 22, 2016, now Pat. No. 10,058,892.

(60) Provisional application No. 62/164,108, filed on May 20, 2015.

(51) Int. Cl.
  *H01L 21/00* (2006.01)
  *F16B 11/00* (2006.01)

(52) U.S. Cl.
  CPC ...... *H01L 21/00* (2013.01); *B81B 2201/0271* (2013.01); *B81B 2201/032* (2013.01); *B81B 2203/0127* (2013.01); *B81C 2203/032* (2013.01)

(56) References Cited

U.S. PATENT DOCUMENTS

| | | | |
|---|---|---|---|
| 5,982,709 A | 11/1999 | Ladabaum et al. | |
| 6,430,109 B1 | 8/2002 | Khuri-Yakub | |
| 7,626,891 B2 | 12/2009 | Chang | |
| 7,937,834 B2 | 5/2011 | Chang et al. | |
| 8,040,020 B2 | 10/2011 | Martin et al. | |
| 8,371,018 B2 | 2/2013 | Chang | |
| 8,398,551 B2 | 3/2013 | Adachi et al. | |
| 8,455,289 B1 | 6/2013 | Adler et al. | |
| 8,531,919 B2 | 9/2013 | Cheng et al. | |
| 9,313,578 B2 | 4/2016 | Pang | |
| 2004/0249285 A1 | 12/2004 | Deng et al. | |
| 2005/0255668 A1 | 11/2005 | Tseng et al. | |
| 2006/0043598 A1 | 3/2006 | Kirby et al. | |
| 2007/0016071 A1 | 1/2007 | Eberle et al. | |
| 2007/0113658 A1 | 5/2007 | Combi et al. | |
| 2007/0153632 A1 | 7/2007 | Chang et al. | |
| 2007/0164632 A1 | 7/2007 | Adachi et al. | |
| 2007/0222339 A1 | 9/2007 | Lukacs et al. | |
| 2007/0277618 A1 | 12/2007 | Kroeger et al. | |
| 2008/0086056 A1 | 4/2008 | Chang et al. | |
| 2008/0139946 A1 | 6/2008 | Adachi et al. | |
| 2008/0185937 A1 | 8/2008 | Ketterling et al. | |
| 2008/0235936 A1 | 10/2008 | Chang et al. | |
| 2008/0290756 A1 | 11/2008 | Huang | |
| 2008/0290757 A1 | 11/2008 | Gao et al. | |
| 2010/0207484 A1 | 8/2010 | Chang | |
| 2011/0068654 A1 | 3/2011 | Cheng et al. | |
| 2011/0085684 A1 | 4/2011 | Kim et al. | |
| 2011/0198970 A1 | 8/2011 | Martin et al. | |
| 2011/0242932 A1 | 10/2011 | Lebental et al. | |
| 2013/0140704 A1 | 6/2013 | Adler et al. | |
| 2013/0160555 A1 | 6/2013 | Buccafusca et al. | |
| 2014/0069194 A1 | 3/2014 | Kim | |
| 2014/0264651 A1 | 9/2014 | Dehe et al. | |
| 2015/0082890 A1 | 3/2015 | Pant et al. | |
| 2015/0281845 A1 | 10/2015 | Pang | |
| 2016/0340178 A1 | 11/2016 | Joyce et al. | |

OTHER PUBLICATIONS

International Search Report and Written Opinion dated Aug. 16, 2016 as received in Application No. PCT/US2016/033372.

Invitation to Pay Additional Fees issued in PCT/US2016/033369 on Jul. 19, 2016.

Non-Patent literature documents are located in U.S. Appl. No. 15/154,900.

MEMBRANE BONDING WITH PHOTORESIST

CROSS REFERENCE TO RELATED APPLICATIONS

This application claims priority to U.S. patent application Ser. No. 15/077,734, filed on Mar. 22, 2016, and to U.S. Provisional Patent Application No. 62/164,108, filed on May 20, 2015, both of which are incorporated by reference in their entirety.

BACKGROUND

Electromechanically active devices may be used in a variety of applications. For example, electromechanically active devices may be used in transducers, sensors, and, actuators. In some uses, the electromechanically active device may be used to generate soundwaves, including ultrasonic sound waves, through vibration of the electromechanically active device. A membrane, or diaphragm, may be added to the electromechanically active device to provide additional surface area to move a medium, such as the air, with the vibrations of the electromechanically active device. The membrane may be tuned to optimize various parameters of the performance of the electromechanically active device, such as enabling efficient energy transfer between different media or tuning resonant performance of the electromechanically active device to a specific frequency.

BRIEF SUMMARY

According to an implementation of the disclosed subject matter, photoresist may be applied to an ultrasonic device. A first portion of the photoresist on the ultrasonic device may be covered. A second portion of the photoresist that was not covered may be exposed to a light source. Either the first portion of the photoresist or the second portion of the photoresist may be removed to create a remaining portion of the photoresist on the ultrasonic device. A bonding agent may be applied to the remaining portion of the photoresist on the ultrasonic device. A membrane may be placed on the ultrasonic device such that the membrane is in contact with the ultrasonic device through the bonding agent. The membrane and the ultrasonic device may be placed in between a first flat plate and a second flat plate, such that the second flat plate rests on top of the membrane. Light pressure may be applied to the membrane, wherein the light pressure is applied by one or more of the weight of the second flat plate and a pressure providing device applying pressure to either or both of the first flat plate and the second flat plate.

A photoresist may be applied to an ultrasonic device. A first portion of the photoresist on the ultrasonic device may be covered. A second portion of the photoresist that was not covered may be exposed to a light source. The second portion of the photoresist may form transducer cell boundaries between ultrasonic transducers of the ultrasonic device and may form photoresist dots on the tips of electromechanically active devices of the ultrasonic device. The first portion of the photoresist may be removed to create a remaining portion of the photoresist on the ultrasonic device. The remaining portion of the photoresist may include the second portion of the photoresist. An epoxy may be applied to the remaining portion of the photoresist on the ultrasonic device. The epoxy may form epoxy lines on the ultrasonic device. The epoxy may be applied to photoresist on the electromechanically active devices of the ultrasonic transducers. A membrane may be placed on the ultrasonic device such that the membrane is in contact with the epoxy. The membrane may cover one or more of the ultrasonic transducers. The membrane and the ultrasonic device may be placed between a first flat plate and a second flat plate. The second flat plate may be in contact with the membrane and the first flat plate may be in contact with the ultrasonic device opposite the second flat plate. Light pressure may be applied to the membrane or the ultrasonic device through either or both of the first flat plate and the second flat plate for at least part of the curing time of the epoxy.

A photoresist may be applied to an ultrasonic device. A first portion of the photoresist on the ultrasonic device may be covered. A second portion of the photoresist that was not covered may be exposed to a light source. The first portion of the photoresist may form transducer cell boundaries between ultrasonic transducers of the ultrasonic device and may form photoresist dots on the tips of electromechanically active devices of the ultrasonic device. The second portion of the photoresist may be removed to create a remaining portion of the photoresist on the ultrasonic device. The remaining portion of the photoresist may include the first portion of the photoresist. An epoxy may be applied to the remaining portion of the photoresist on the ultrasonic device. The epoxy may form epoxy lines on the ultrasonic device. The epoxy may be applied to photoresist on the electromechanically active devices of the ultrasonic transducers. A membrane may be placed on the ultrasonic device such that the membrane is in contact with the epoxy. The membrane may cover one or more of the ultrasonic transducers. The membrane and the ultrasonic device may be placed between a first flat plate and a second flat plate. The second flat plate may be in contact with the membrane and the first flat plate may be in contact with the ultrasonic device opposite the second flat plate. Light pressure may be applied to the membrane or the ultrasonic device through either or both of the first flat plate and the second flat plate for at least part of the curing time of the epoxy.

Systems and techniques disclosed herein may allow for membrane bonding. Additional features, advantages, and embodiments of the disclosed subject matter may be set forth or apparent from consideration of the following detailed description, drawings, and claims. Moreover, it is to be understood that both the foregoing summary and the following detailed description are examples and are intended to provide further explanation without limiting the scope of the claims.

BRIEF DESCRIPTION OF THE DRAWINGS

The accompanying drawings, which are included to provide a further understanding of the disclosed subject matter, are incorporated in and constitute a part of this specification. The drawings also illustrate embodiments of the disclosed subject matter and together with the detailed description serve to explain the principles of embodiments of the disclosed subject matter. No attempt is made to show structural details in more detail than may be necessary for a fundamental understanding of the disclosed subject matter and various ways in which it may be practiced.

DETAILED DESCRIPTION

Figure 1:
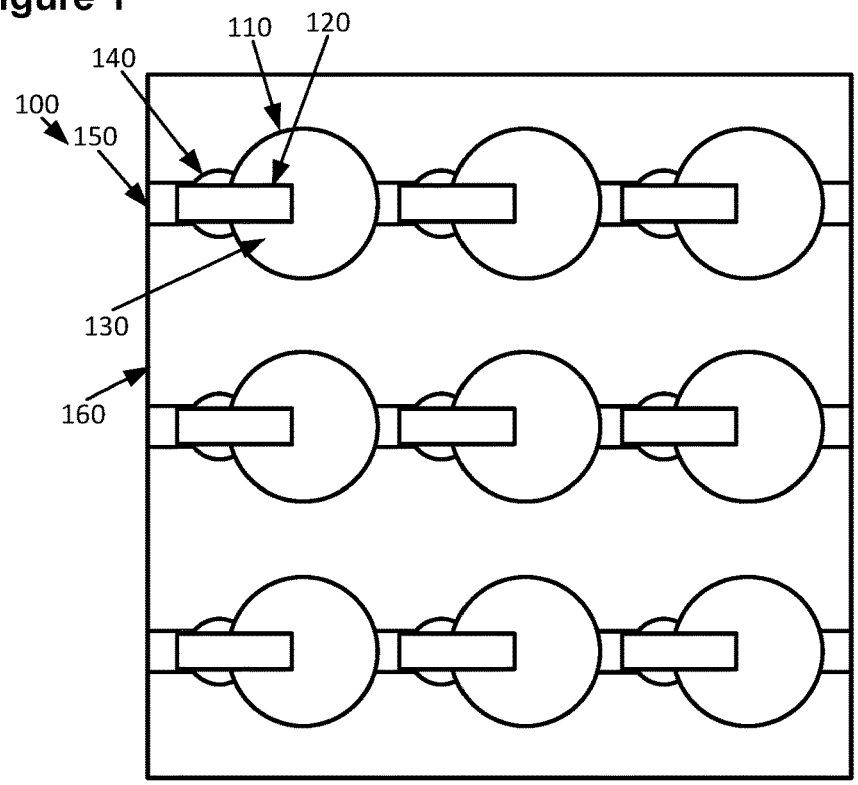
FIG. 1 shows an example ultrasonic device according to an implementation of the disclosed subject matter.

According to embodiments disclosed herein, membrane bonding may allow for the bonding of a membrane to an electromechanically active device.

An ultrasonic device may include ultrasonic transducers on a substrate, such as on a Printed Circuit Board (PCB.) An ultrasonic transducer may include an electromechanically active device, such as a cantilever or flexure, attached to the wall of a cavity in the substrate. A stencil may be placed over the ultrasonic device. The stencil may be used to apply epoxy in a border around individual ultrasonic transducers and to the tips of the electromechanically active devices. A membrane may be placed on top of the ultrasonic device and pressed into the epoxy. The ultrasonic device, with the membrane, may be placed between flat plates, which may be used to apply light pressure to the ultrasonic device and membrane. The ultrasonic device and membrane may be left under pressure for the cure cycle of the epoxy. After the epoxy has cured, the membrane may be bonded to the ultrasonic device, with each ultrasonic transducer of the ultrasonic device being bonded to a separate section of the membrane. Bond lines of epoxy may separate the sections of the membrane, allowing them to move separately.

An ultrasonic device may include transducers on a substrate. The substrate may be any suitable material, and may be, for example, a PCB with any suitable number of layers. The substrate may be in any suitable shape, and the surface of the substrate may be flat, or may be curved or textured in any suitable manner. A transducer of an ultrasonic device may include an electromechanically active device attached to a wall of a cavity in the substrate. The electromechanically active device may be a cantilever or flexure, and may be, for example, a piezoceramic unimorph or bimorph. The cavity may be any suitable shape and depth. For example, the cavity may be circular. The cavity may be created in the substrate in any suitable manner, including through subtractive processes, such as drilling, or additive processes. The electromechanically active device may be attached to the wall of the cavity in any suitable manner. For example, a step structure may be created on an edge of the cavity, and the electromechanically active device may be bonded to the step structure using any suitable adhesive, such as, for example, conductive epoxy. The electromechanically active device may be any suitable length and width for vibration at ultrasonic frequencies, and may be oriented in the cavity at any suitable angle. For example, the electromechanically active device may reach approximately halfway across the cavity. The top surface of the electromechanically active device, which may be, for example, a passive material of a unimorph or an active material of a bimorph, may be level, or near-level, with the top of the cavity. In some implementations, a transducer may include more than one electromechanically active device within a cavity. The ultrasonic device may include any number of ultrasonic transducers in any suitable arrangement.

A membrane may be bonded to the ultrasonic device to create an ultrasonic device with a membrane. The membrane and electromechanically active devices of an ultrasonic device may be cleaned using any suitable solvents and acids. For example, acetone, methanol, isopropanol may be used to clean bonding surfaces of the electromechanically active devices. Chromic acid, hydrochloric acid, and other suitable substances or materials which may be promote adhesion may also be used to clean the electromechanically active devices. The electromechanically active devices may also be cleaned using an ultrasonic bath or plasma etching. The membrane may be cut larger than the area needed to cover the ultrasonic device. The membrane may be any suitable material or composite material structure, which may be of any suitable stiffness and weight, for vibrating at ultrasonic frequencies. For example, the membrane may be both stiff and light. For example, the membrane may be aluminum shim stock, metal-patterned Kapton, polyimide, or any other metal-pattern film. The membrane may be impedance matched with the air to allow for more efficient air-coupling of the ultrasonic transducers. The membrane may include additional structures, such as, for example, ring structures located on the membrane where the membrane will contact the tips of the electromechanically active devices. After being cut, the side of the membrane which will be bonded to the ultrasonic device, or bonding surface, may have surface preparations applied to promote adhesion of an epoxy. These preparations may include plasma cleaning, chemical etching, mechanical texturing, or chemical activation. For example, the bonding surface of the membrane may be textured using sandpaper, an abrasive cleaning pad, or an abrasive slurry. The bonding surface of the membrane may be cleaned using isopropanol.

An epoxy or other suitable bonding agent may be used to bond the membrane to the ultrasonic device. The membrane may be bonded to the substrate of the ultrasonic device, as well as to the electromechanically active devices of the ultrasonic transducers. The epoxy may be conductive or non-conductive. The epoxy may have a high viscosity while still being spreadable. The epoxy may have any suitable curing schedule. For example, the epoxy may have a curing schedule that may allow the epoxy to cure while staying below 90 degrees Celsius. This may allow the epoxy to be cured without causing an electrically active material, such as a piezoceramic, of an electromechanically active device to reach its Curie temperature during the curing of the epoxy. The epoxy may cure within 48 hours. The epoxy may be mixed with glass microspheres whose diameter falls within a given range and that may have a target size. The diameters of the spheres may be narrowly distributed about the target size. For example, if the target size is 100 micrometers, then over 95% of the spheres may have diameters within a few percent of 100 micrometers. The glass microspheres may have any suitable diameter, such as from 10 to 100 micrometers in diameter. The glass microspheres may be used to determine the thickness, up from the surface of the ultrasonic device, of the bond lines formed by the cured epoxy, as the bond may be as thick as the thickness of the glass microspheres. The glass microspheres may also allow the epoxy to form standoffs between the tips, of the electromechanically active devices and the membrane, separating them by more than just the thickness of the epoxy alone. The amount of glass microspheres mixed with the epoxy may be high enough to allow proper distribution of the glass microspheres throughout the epoxy and low enough to not alter the properties of the bond formed by the cured epoxy in any significant manner. When pressure is applied to the bond, the glass microspheres of a given diameter may stop the two sides from moving together so that the separation between the sides is about equal to the given diameter of the microspheres.

The epoxy may be applied to the ultrasonic device. For example, the epoxy may be applied using screen printing techniques. A stencil may be placed over the ultrasonic device. The stencil may be made of any suitable material, including metal, such as stainless steel, or polyimide, may be of any suitable thickness, for example, from 25 micrometers to 100 micrometers thick, and may be patterned. For example, the stencil may be stainless steel that is 50 micrometers thick. The pattern of the stencil may include openings or apertures, which may be in any suitable shapes, such as, for example, squares, circles, and hexagons. The pattern of the stencil may, for example, include an array of dashed squares with dots at the center. The dashed squares may be patterned with any suitable number of dashes. For example, each dashed square may have two dashes per side, with sides shared by neighboring squares. The size of the dashed squares may define the size of an ultrasonic transducer cell of the ultrasonic device. The width of the dashes may affect the size of the ultrasonic transducers cells, and the area of the section of the membrane that moves, and may be as thin as possible in order to allow for larger ultrasonic transducer cells. In some implementations, the stencil pattern may result in an ultrasonic transducer cell including more than one ultrasonic transducer. The dots may be positioned such that epoxy applied through the dots when the stencil is placed over the ultrasonic device may be deposited onto the tips of the free ends of the electromechanically active devices. The stencil may be placed over the ultrasonic device using predrilled fiducials in both the stencil and the ultrasonic device to obtain proper alignment. Epoxy may be spread over the stencil using a metal straight edge or non-compliant rubber squeegee, applying the epoxy to the ultrasonic device through the openings in the stencil. For example, the epoxy may form squares, or dashed squares, around each ultrasonic transducer, with a dot of epoxy applied to the tip of the free end of each ultrasonic transducer's electromechanically active device. The stencil may be removed after the epoxy has been applied.

The ultrasonic device, with applied epoxy, may be placed on a first flat plate, which may rest on or be attached to a surface. The first flat plate may be any suitable material, and any suitable thickness. The membrane may be placed onto the ultrasonic device. The membrane may be placed with the prepared bonding surface of the membrane coming into contact with the epoxy on the ultrasonic device. A second flat plate may be placed on top of the membrane, and may be used to apply light pressure to the membrane and ultrasonic device, ensuring contact between the membrane and the epoxy on the ultrasonic device. The light pressure may be, for example, ¼ PSI or above while being below a pressure level that would crack the glass microspheres of the epoxy. Pressure may be applied in any suitable manner, including, for example, through the weight of the second flat plate on top of the membrane, or through a pneumatic cylinder or other pressure providing device which may be used to provide a controlled amount of sustained pressure to the second flat plate. The light pressure may be kept on the membrane for the duration of the cure cycle of the epoxy, or may be removed part way through the cure cycle. In some implementations, pressure may be provided by the weight of the first flat plate. For example, the membrane may be placed on top of the second flat plate, with the ultrasonic device on top of the membrane. The first flat plate may then be placed on top of the ultrasonic device, with the weight of the first flat plate applying pressure that may push the ultrasonic device towards the membrane. The first flat plate may also be attached to a pressure providing device instead of, or along with, the second flat plate.

When the cure cycle of the epoxy has completed, the ultrasonic device with attached membrane may be removed from between the flat plates. The membrane may be attached to the ultrasonic device along bond lines formed by the cured epoxy. The bond lines may reflect the pattern of the stencil, for example, forming a grid and dividing the ultrasonic device into square ultrasonic transducer cells. The membrane may also be bonded to the tips of the free end of each electromechanically active device of the ultrasonic device. This may result in each ultrasonic transducer being covered with a section of the membrane that is bonded to the substrate of the ultrasonic device around the ultrasonic transducer and also bonded to the tip of the free end of the ultrasonic transducer's electromechanically active device. The tip of the free end of the electromechanically active device may be slightly off being aligned with the center of the section of the membrane. This may allow the section of the membrane to be pushed outward by the electromechanically active device so that the highest point of the section of the membrane is at the center of the section of the membrane. Each section of the membrane may be able to move independently of any other section of the membrane, though the membrane may remain a single piece of material. The bond lines formed by the cured epoxy may mechanically isolate the sections of the membrane from each other. The movement of one section of the membrane may not be transmitted across a bond line, where the membrane is bonded to the substrate, to another section of the membrane.

In some implementations, the epoxy or other suitable bonding agent may be applied directly to the bonding surface of the membrane in addition to, or in lieu of, of the application of the epoxy or bonding agent to the ultrasonic device. The epoxy or bonding agent may be applied to the bonding surface of the membrane using screen printing techniques and a stencil. The stencil may include the same pattern as the stencil that may be used to apply epoxy or a bonding agent to the ultrasonic device, or may have a different, for example, complementary, pattern. For example, a stencil may be used to apply epoxy to the bonding surface of the membrane to form a grid pattern, while a second stencil may be used to apply epoxy dots to the tips of the free ends of the electromechanically active devices.

In some implementations, more than one membrane may bonded to an ultrasonic device. For example, multiple separate membranes of the same material, or different materials may be used to cover the ultrasonic transducers of an ultrasonic device. Different materials may be used, for example, to allow different sections of the ultrasonic device to have different operating characteristics.

In some implementations, a photoresist may be applied to the ultrasonic device or membrane, or to a laminate material that may be used as a component of an ultrasonic device. The photoresist may be, for example, a dry film photoresist such as a Kapton polyimide film, liquid photoresist, benzocyclobutene (BCB) photoresist, or polyimide photoresist, or other photo-definable material, and may be either a positive or negative photoresist. The photoresist may be applied before the application of the epoxy. For example, after the electromechanically active devices of an ultrasonic device have been cleaned, photoresist may be applied to the surface of the ultrasonic device that will be covered by the membrane. The photoresist may cover the entire surface of the ultrasonic device, including areas on the surface that may not be covered by the membrane. The photoresist may be of any suitable thickness. For example, a dry film photoresist may be 15-20 microns thick, and a liquid photoresist may be applied to a thickness of 15-20 microns.

The surface covered by the photoresist may include the top surface of the electromechanically active devices. After being applied, the photoresist may be partially covered. The partial covering of the photoresist may be accomplished in any suitable manner, using any suitable covering. For example, a single stencil may be used, or multiple stencils, such as, for example, one stencil per electromechanically active device of the ultrasonic device, may be used. Coverings used to cover the portions of the photoresist may be made of any suitable material. For example, the coverings may be impenetrable to ultraviolet (UV) light. The portion of the photoresist that is covered may depend on whether the photoresist is, for example, a positive or negative photoresist. If the photoresist is a negative photoresist, portions of the photoresist may be covered so that the uncovered portions of the photoresist form the outlines of the transducer cells and the dots near the tips of the electromechanically active devices. If the photoresist is a positive photoresist, portions of the photoresist may be left uncovered so that the covered portions of the photoresist form the outlines of the transducers cells and the dots near the tips of the electromechanically active devices. The coverings may be placed directly onto the photoresist, or may be held above the photoresist.

The uncovered portions of the photoresist may be exposed to a suitable light source. For example, the uncovered portions of the photoresist may be exposed to a UV light source emitting any suitable wavelengths of UV light. If the photoresist is a negative photoresist, the exposure to a light source may cause the uncovered portions of the photoresist to become less soluble to a developer for the photoresist. If the photoresist is a positive photoresist, the exposure to a light source may cause the uncovered portion of the photoresist to become more soluble to a developer for the photoresist. The uncovered portions of the photoresist may be exposed to the light source for any suitable length of time. The light source may be removed from the photoresist, for example, switching off or moving the light source or moving the ultrasonic device, and the coverings may be removed from the ultrasonic device. A suitable developer, which may be a liquid developer for a photoresist, may be applied to the ultrasonic device. If the photoresist is a positive photoresist, the portions of the photoresist which were uncovered while the photoresist was exposed to the light source may be washed away, having been made soluble to the developer liquid. If the photoresist is a negative photoresist, the portions of the photoresist which were covered while the photoresist was exposed to the light source may be washed away, as the uncovered portions of the photoresist may have been made less soluble to the developer liquid while the covered portions remained soluble. The photoresist which remains on the ultrasonic device may outline the transducer cells and may form dots on the tips of the electromechanically active devices.

Epoxy may be applied to the photoresist that remains on the ultrasonic transducer. The epoxy may be applied in any suitable manner. For example, the epoxy may be applied using a roller, screen printing techniques, or inkjet printing. The epoxy may be applied such that epoxy is only applied on top of the photoresist on the ultrasonic device. For example, a roller may apply epoxy by being rolled across the ultrasonic device at a height such that the roller only makes contact with, and applies epoxy to, the top of the photoresist, which may be 15-20 microns above the surface of the ultrasonic device, including the surface of the electromechanically active devices. The epoxy may be any suitable epoxy with any suitable curing schedule. For example, when a roller is used to apply the epoxy, and suitable epoxy for rolling application may be used. The epoxy may not need to be mixed with glass microspheres. The membrane may then be bonded to the ultrasonic device, for example, by placing the membrane and ultrasonic device between two flat plates. When the cure cycle of the epoxy has completed, the membrane may be attached to the ultrasonic device along bond lines formed by the cured epoxy on top of the photoresist that remained on the ultrasonic device, and at the bond formed by the epoxy on the dot of photoresist at the tip of the electromechanically active devices of the ultrasonic device.

In some implementations, the photoresist may be applied to the membrane as well as or instead of, being applied to the ultrasonic device. The photoresist may be applied to the membrane, covered, exposed to a light source, and washed similarly to the ultrasonic device. The epoxy may then be applied to the photoresist on the membrane, for example, using a roller, screen printing techniques, or inkjet printing. The membrane may be bonded to the ultrasonic device, which may or may not have applied photoresist and epoxy.

In some implementations, the electromechanically active devices for an ultrasonic device may be created within a laminate material that includes a piezoceramic layer bonded to a conductive substrate, such as, for example, aluminum, stainless steel, or brass. The electromechanically active devices may be piezoceramic flexures that may be created by removing portions of the laminate material in a U-shape, or other suitable, non-closed, shape, leaving a piezoceramic flexure that remains connected to the rest of the laminate material. Multiple piezoceramic flexures may be created within the same piece of laminate material. To create an array of transducers, the laminate material may be attached to a substrate, such as, for example, a PCB, which may have a number of cavities. The cavities may be aligned with the piezoceramic flexures created in the laminate material to form transducers. For example, each piezoceramic flexure of the laminate material may be able to move downwards into one of the cavities in the substrate. Electrical conduction between the transducers may be possible through the laminate material. For example, the transducers may be single-ended and may share a common ground. In some implementations, the piezoceramic flexures may be bimorphs, created from a laminate material which includes bonded piezoceramic layers.

Before a membrane is bonded to an ultrasonic device made from a laminate material attached to a substrate, epoxy may be applied directly to the laminate material, for example, using a stencil and screen printing techniques. This may result in dots of epoxy on the tips of the piezoceramic flexures created within the laminate material. Photoresist may also be applied to the laminate material before the epoxy is applied to the photoresist.

FIG. 1 shows an example ultrasonic device according to an implementation of the disclosed subject matter. An ultrasonic device 100 may include a substrate 160 and ultrasonic transducers 110. The ultrasonic transducers 110 may include a main cavity 130, a secondary cavity 140, a channel 150, and an electromechanically active device 120. The substrate 160 may be any suitable substrate, such as, for example, a PCB, and may be in any suitable shape and of any suitable thickness. The substrate 160 may include any number of fiducials, which may be, for example, predrilled. The first cavity 130 may be a cavity in the substrate 160, formed through any suitable additive or subtractive processes, and may be any suitable shape and any suitable depth. For example, the cavity 130 may be circular. The second cavity 140 may be a cavity in the substrate 160 which may overlap the first cavity 130, and may any suitable shape and any suitable depth. For example, the second cavity 140 may be a circular cavity of less depth than the first cavity 130, forming a first stair step at its intersection with the first cavity 130. The channel 150 may be a channel of any suitable width and depth, made in any suitable manner, which may run through the centers of the first cavity 130 and the second cavity 140. For example, the channel 150 may be made using a dicing saw cut of any suitable width through the first cavity 130 and the second cavity 140. The channel 150 may be shallower than the second cavity 140, so that the channel forms second stair step where it overlaps the second cavity 140. The second stair step may be in alignment with the first stair step. The channel 150 may run across a number of ultrasonic transducers 110, for example, if the ultrasonic transducers 110 are aligned on the substrate 160 so that a straight line cut from a dicing saw may pass through the centers of all of the first cavities 130 and second cavities 140 in a group of aligned ultrasonic transducers 110.

The electromechanically active device 120 may be any suitable electromechanically active device such as, for example, piezoelectric unimorph or bimorph which may use piezoceramic material bonded to an electrically inactive substrate. The electromechanically active device 120 may be any suitable shape, and may, be for example, a cantilever or flexure. The electromechanically active device 120 of the ultrasonic transducer 110 may be bonded to the substrate 160 at the first and second stair steps, with the free end of the electromechanically active device 120 projecting out over the bottom of the first cavity 130. The first and second stair steps may also include electrodes connected to vias which may go into the substrate 160, and may be bonded to electrodes of the electromechanically active device 120 using conductive epoxy. The top surface of the electromechanically active device 120 may be level with, or slightly below, the top surface of the substrate 160.

Figure 2:
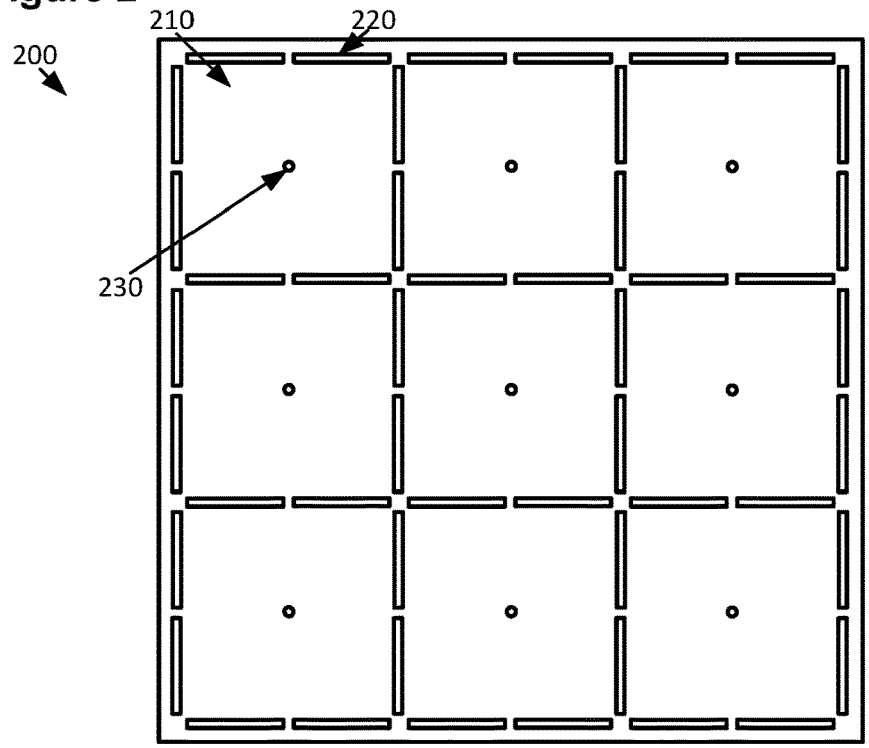
FIG. 2 shows an example stencil according to an implementation of the disclosed subject matter.

FIG. 2 shows an example stencil according to an implementation of the disclosed subject matter. A stencil 200 may include any suitable pattern of openings in any suitable shapes. The shapes may be, for example, squares, circles, rectangles, hexagons, octagons, other regular irregular polygons, or irregular shapes, and may be arranged in any suitable pattern, including a square grid, hex grid, concentric circles or other regular or irregular pattern. The stencil 200 may include any combination of shapes in any combination of patterns. For example, the stencil 200 may include a dashed squared pattern including dashed squares 210. The dashes 220 may be openings in the stencil, and may form a pattern of dashed squares 210 with shared sides. Any number of dashes 220 may be used to form each side of the dashed squares 210 of the stencil 200. The center of each of the dashed squares 210 may include a dot 230, which may be a circular opening in the stencil 200, or may be any other suitably shaped opening. The stencil 200 may have any suitable thickness, and may be, for example, between 25 micrometers and 100 micrometers thick. The stencil 200 may be made from any suitable material, including metals and polyimides. For example, the stencil 200 may be 50 micrometer thick stainless steel. The stencil 200 may include any suitable number of fiducials, which may be, for example, predrilled, to allow for alignment of the stencil 200 with the ultrasonic device 100 based on the fiducials of the substrate 160.

Figure 3:
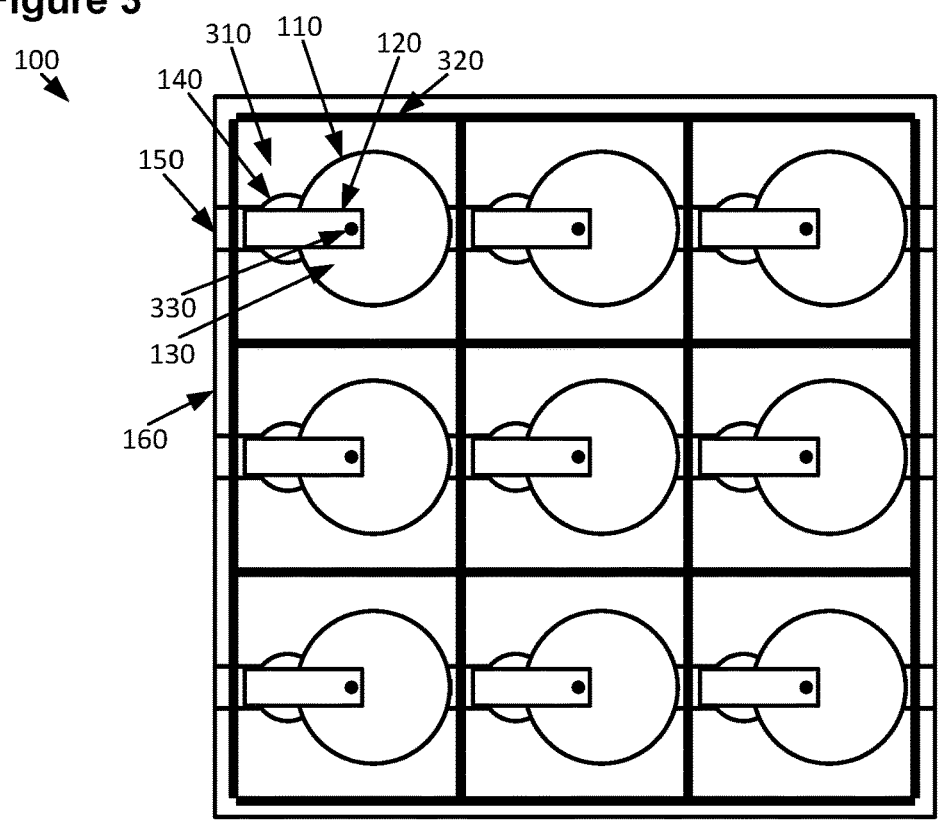
FIG. 3 shows an example ultrasonic device according to an implementation of the disclosed subject matter.

FIG. 3 shows an example ultrasonic device according to an implementation of the disclosed subject matter. The electromechanically active devices 120 of the ultrasonic device 100 may be cleaned using solvents and acids. For example, acetone, methanol, and isopropanol may be used to clean the electromechanically active devices 120. Chromic acid, hydrochloric acid, and various other materials which may promote adhesion may also be used.

The stencil 200 may be placed over the ultrasonic device 100. The stencil 200 may be aligned with the ultrasonic device 100 so that the dots 230 are placed over the tips of the free ends of the electromechanically active devices 120. Fiducials on the stencil 200 and the substrate 160 may be used to obtain proper alignment of the stencil 200 with the ultrasonic device 100. Epoxy may be applied to the ultrasonic device 100 through the stencil 200 using screen printing techniques. For example, epoxy may be applied through the openings in the stencil 200, such as the dashes 200 and the dots 230, by using a metal straight-edge or non-compliant rubber squeegee to spread epoxy over the stencil 200. The epoxy may be any suitable epoxy or other bonding agent, may be conductive or non-conductive, and may have a high viscosity while still being spreadable. The epoxy may having a curing schedule that allows the epoxy to cure at temperatures below 90 degrees Celsius, and to cure within 48 hours. The epoxy may be mixed with glass microspheres, which may between 10 micrometers and 100 micrometers in diameter. Enough glass microspheres may be used to allow the glass microspheres to be distributed throughout the epoxy without significantly impacting the properties of the bond formed by the curing the epoxy.

After the epoxy is applied to the ultrasonic device 100, the stencil 200 may be removed. The epoxy applied to the ultrasonic device 100 through the stencil 200 may form epoxy lines 320 and epoxy dots 330. The epoxy lines 320 may form a pattern on the ultrasonic device 100 similar to the pattern of the stencil 200, for example, forming ultrasonic transducer cells 310 which may be the same size as the dashed squares 210 of the stencil 200. The epoxy dots 330 may be located on the tips of the free ends of the electromechanically active devices 120.

In some implementations, the pattern of the stencil 200 may result in different numbers of ultrasonic transducers 110 being included within a single ultrasonic transducer cell 310. For example, each ultrasonic transducer cell 310 may include only one ultrasonic transducer 110, or may include two or more ultrasonic transducers 110.

Figure 4:
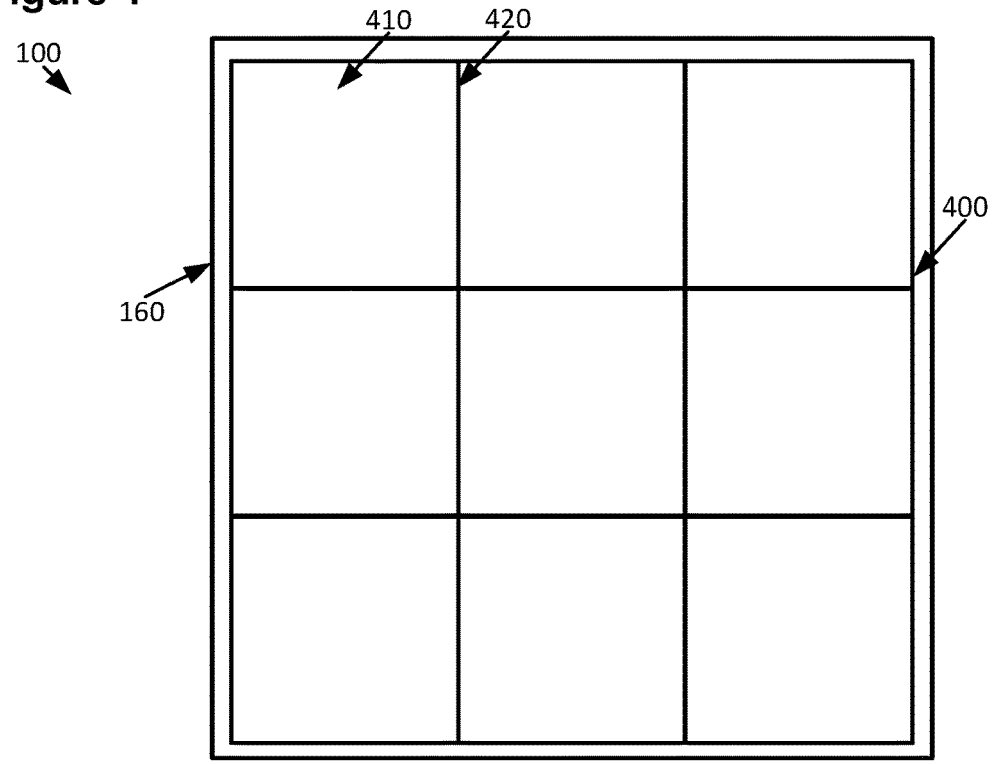
FIG. 4 shows an example of an ultrasonic device according to an implementation of the disclosed subject matter.

FIG. 4 shows an example of an ultrasonic device according to an implementation of the disclosed subject matter. A membrane 400 may be cut to an appropriate size for the ultrasonic device 100, for example, slightly larger than the area which the membrane 400 is intended to cover on the ultrasonic device 100. The membrane 400 may be any suitable light and stiff material for vibrating at ultrasonic frequencies, such as, for example, aluminum shim stock, metal-patterned Kapton, polyimide, or any other metal-patterned film. The membrane 400 may also include suitable patterned structures. One surface of the membrane 400 may be the bonding surface, and may be prepared for bonding using plasma cleaning, chemical etching, mechanical texturing, or chemical activation. The bonding surface of the membrane 400 may also be textured using sandpaper, an abrasive cleaning pad, or an abrasive slurry. The membrane may then be cleaned, for example, with isopropanol.

The membrane 400 may be placed on the ultrasonic device 100 so that the prepared bonding surface of the membrane 400 contacts the epoxy on the ultrasonic device 100. The membrane 400 may be aligned with the ultrasonic device 100 so that it covers all of the epoxy, with the epoxy near the edges of the ultrasonic device 100 covered by the edges of the membrane 400. As the epoxy cures, the membrane 400 may be separated into membrane sections 410 along bond lines 420, which may be the result of cured epoxy lines 320.

Figure 5:
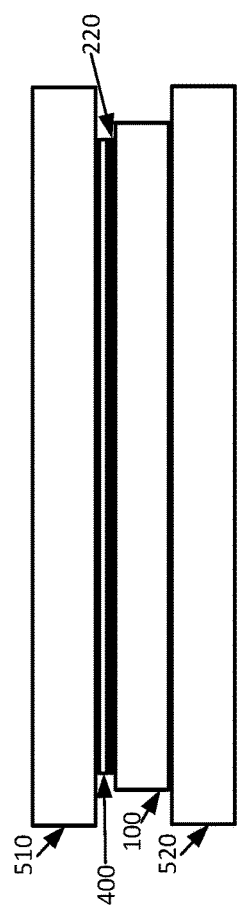
FIG. 5 shows an example of membrane bonding according to an implementation of the disclosed subject matter.

FIG. 5 shows an example of membrane bonding according to an implementation of the disclosed subject matter. The ultrasonic device 100 with the membrane 400 may be placed in between two flat plates 510 and 520. The flat plates 510 and 520 may be made of any suitable material, and may be of any suitable thickness. Light pressure may be applied to the membrane 400 through the flat plate 510 to ensure the membrane 400 remains in contact with the epoxy on the ultrasonic device 100. The pressure may be applied through the weight of the flat plate 510, or through some pressure providing device attached to the flat plate 510 or flat plate 520. Light pressure may be kept on the membrane 400 for the entire curing cycle of the epoxy, or may be removed during the curing cycle. Once the curing cycle of the epoxy has completed, the membrane 400 may be bonded to the ultrasonic device along bond lines 420 and at the locations of the epoxy dots 330, where the electromechanically active devices 120 may be bonded to the membrane 400. This may form membrane sections 410. The membrane sections 410 may be mechanically isolated from each other by the bond lines 420, and may be able to move independently even while the membrane 400 remains in one piece. For example, when each membrane section 410 covers a single ultrasonic transducer 110, a membrane section 410 may be moved by the electromechanically active device 120 of the ultrasonic transducer 110 covered by the membrane section 410 without moving or disturbing any other membrane section 410.

Figure 6:
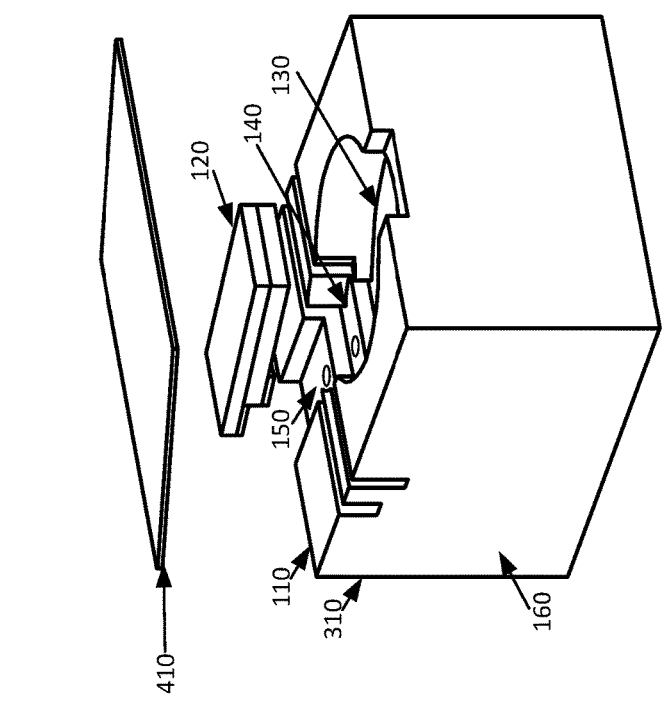
FIG. 6 shows an example ultrasonic transducer cell according to an implementation of the disclosed subject matter.

FIG. 6 shows an example ultrasonic transducer cell according to an implementation of the disclosed subject matter. The ultrasonic transducer cell 310 may include the ultrasonic transducer 110, including the substrate 160, the first cavity 130, the second cavity 140, the channel 150, the electromechanically active device 120, and the membrane section 410.

Figure 7:
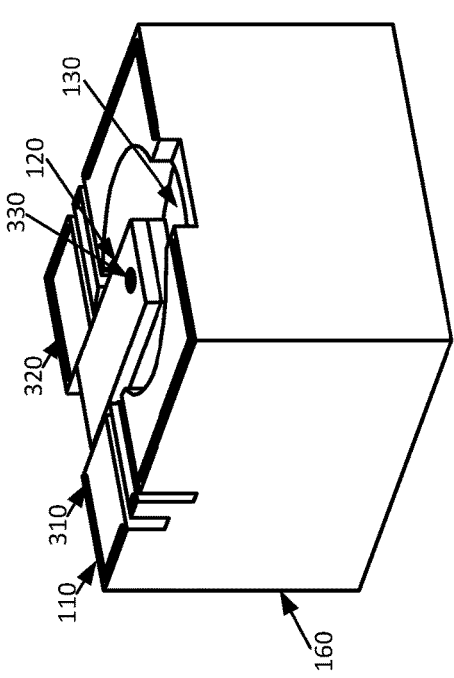
FIG. 7 shows an example ultrasonic transducer cell according to an implementation of the disclosed subject matter.

FIG. 7 shows an example ultrasonic transducer cell according to an implementation of the disclosed subject matter. When the stencil 200 is used to apply epoxy to the ultrasonic device 100, the bond lines 320 may be deposited around the ultrasonic transducer 110, creating the borders of the ultrasonic transducer cell 310. The epoxy dot 330 may be located on the tip of the free end of the electromechanically active device 120, which may project out over the first cavity 130.

Figure 8:
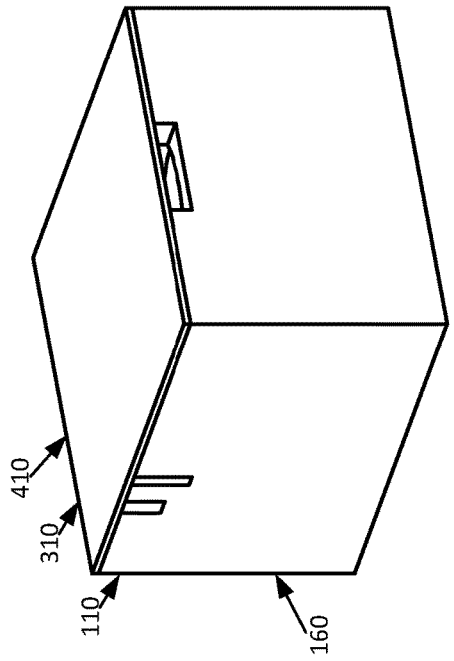
FIG. 8 shows an example ultrasonic transducer cell according to an implementation of the disclosed subject matter.

FIG. 8 shows an example ultrasonic transducer cell according to an implementation of the disclosed subject matter. After the membrane 400 is placed on the ultrasonic device 100 and the epoxy is cured, the membrane section 410 may be bonded along bond lines 420 to the cured epoxy around the borders of the ultrasonic transducer cell 310. The membrane section 410 may cover the ultrasonic transducer 110, and may be bonded to the electromechanically active device 120 by the epoxy dot 330.

Figure 9A:
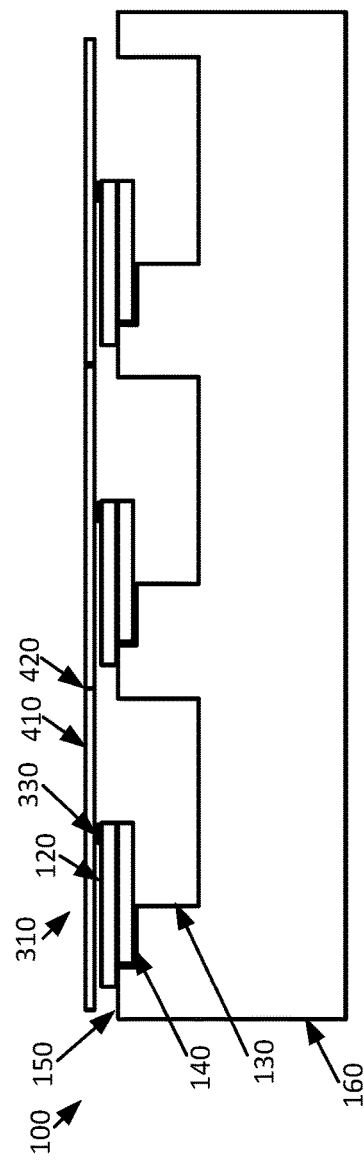
FIG. 9A shows an example ultrasonic device according to an implementation of the disclosed subject matter.

FIG. 9A shows an example ultrasonic device according to an implementation of the disclosed subject matter. Each membrane section 410 of the membrane 400 may cover an ultrasonic transducer 110 of the ultrasonic device 100. The bond lines 420 may mechanically isolate each membrane section 410 through attachment of the membrane 400 to the substrate 160 of the ultrasonic device 100. The membrane section 410 may be held above the top surface of the electromechanically active device 120 by the epoxy dot 330. The epoxy dot 330 may bond the tip of the electromechanically active device 120 slightly off the center of the membrane section 410. The membrane section 410 may cross over the channel 150, and may be bonded to the substrate 160 on either side of the channel 150.

Figure 9B:
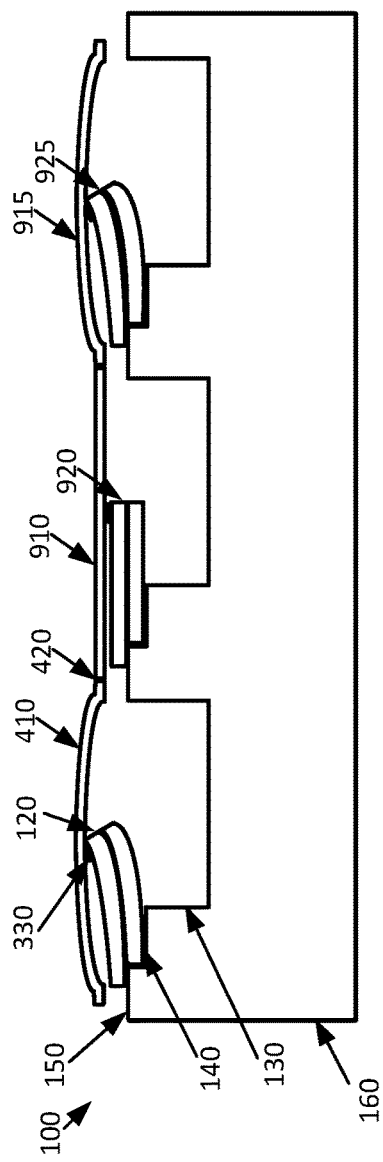
FIG. 9B shows an example ultrasonic device according to an implementation of the disclosed subject matter.

FIG. 9B shows an example ultrasonic device according to an implementation of the disclosed subject matter. The membrane sections, such as membrane sections 410, 910, and 915, of the membrane 400 may be mechanically isolated from each other by the bond between the membrane 400 and the substrate 160 along the bond lines 420. For example, when the electromechanically active device 120 is activated and flexes upward, the membrane section 410 may be pushed upwards at the location of the epoxy dot 330. Because the epoxy dot 330 is slightly off center, the membrane section 410 may be pushed upwards at its center by the epoxy dot 330 and the flexed tip of the electromechanically active device 120. The bond lines 420 may mechanically isolate the membrane section 410 from neighboring membrane section 910, so that movement of the membrane section 410 due to movement of the electromechanically active device 120 does not cause any movement or disturbance of the membrane section 910. Similarly, the electromechanically active device 925 may be activated and flex upward, pushing up the membrane section 915. The neighboring membrane section 910 may be mechanically isolated from the membrane section 915 by the bond lines 420.

Figure 10:
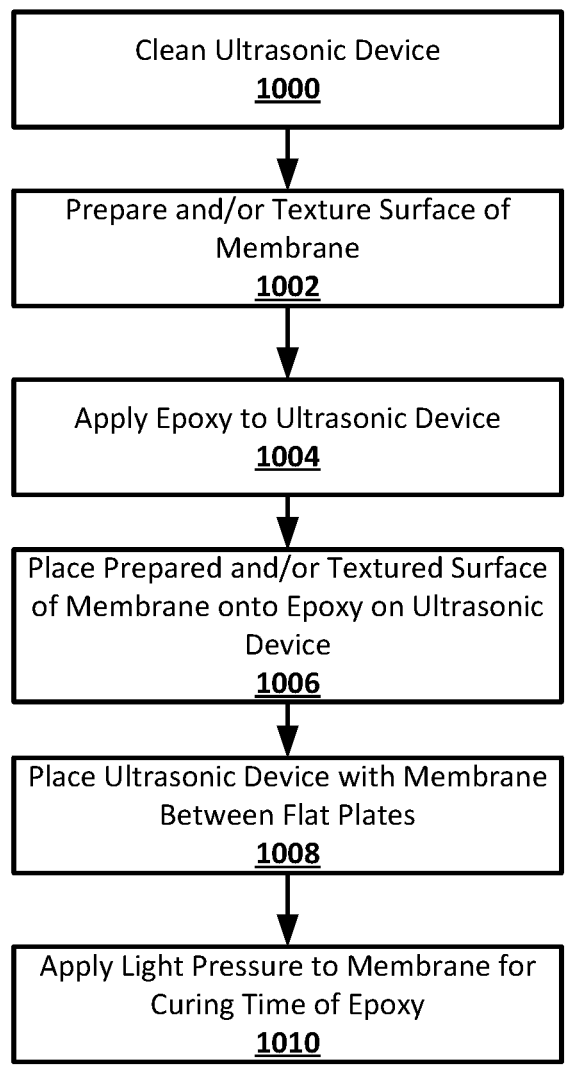
FIG. 10 shows an example process suitable for membrane bonding according to an implementation of the disclosed subject matter.

FIG. 10 shows a process suitable for membrane bonding according to an implementation of the disclosed subject matter. At 1000, an ultrasonic device may be cleaned. For example, the electromechanically active devices 120 of the ultrasonic device 100 may be cleaned using any suitable solvents. The solvents may be, for example, acetone, methanol, and isopropanol, or chromic acid, hydrochloric acid, or other materials that may promote adhesion.

At 1002, a surface of a membrane may be prepared for bonding. For example, a surface of the membrane 400 may be plasma cleaned, chemically etched, textured with sandpaper, an abrasive cleaning pad, or an abrasive slurry, and chemically activated with an adhesion promotor. The membrane 400 may made of aluminum shim stock, metal-patterned Kapton, polyimide, other metal-patterned film, or any other suitable light, stiff material. After a surface of the membrane 400 is roughened, the membrane 400 may be cleaned, for example, with isopropanol.

At 1004, epoxy may be applied to the ultrasonic device. For example, the stencil 200 may be placed on the ultrasonic device 100, covering the ultrasonic transducers 110. An epoxy, which may be conductive or non-conductive, may be applied to the ultrasonic device 100 through openings or apertures in the stencil 200, such as the dashes 220 and the dots 230, using a metal straight edge or non-compliant rubber-backed squeegee. The epoxy may be mixed with glass microspheres, which may be between 25 micrometers and 100 micrometers in diameter. The stencil 200 may be patterned, for example, with dashed squares 210, and the epoxy may form the pattern of the stencil 200 on the ultrasonic device 100. The stencil 200 may be removed from the ultrasonic device 100 after application of the epoxy. The epoxy lines 320 may divide the ultrasonic device 100 into ultrasonic transducer cells 310. Each ultrasonic transducer cell 310 may include any number of ultrasonic transducers 110. For example, each ultrasonic transducer cell 310 may include a single ultrasonic transducer 110. The ultrasonic transducer cells 310 may have any suitable shapes, which may be determined by the pattern of the stencil 200.

At 1006, the roughened surface of the membrane may be placed on the epoxy on the ultrasonic device. For example, the roughened surface of the membrane 400 may be placed on the ultrasonic device 100 to be in contact with the epoxy. The membrane 400 may cover the ultrasonic transducers 110 of the ultrasonic device 100. In some implementations, the membrane 400 may cover only some of the ultrasonic transducers 110.

At 1008, the ultrasonic device with the membrane may be placed between flat plates. For example, the ultrasonic device 100 with the membrane 400 may be placed between flat plates 510 and 520. The bottom of the ultrasonic device 100 may be placed onto the flat plate 520, and the flat plate 510 may be placed on top of the membrane 400.

At 1010, light pressure may be applied to the membrane for the curing time of the epoxy. For example, the weight of the flat plate 510 may apply light pressure to the membrane 400, ensuring it remains in contact with the epoxy on the ultrasonic device 100, or pressure may be applied through the flat plate 510 using any suitable pressure providing device. The pressure may push the membrane 400 towards the ultrasonic device 100. The light pressure may be applied for the curing time of the epoxy. The curing time may be, for example, less than 48 hours, and the curing temperature may be less than 90 degrees Celsius. In some implementations, the light pressure may be removed before the end of the curing time. After the epoxy has cured, the membrane 400 may be bonded to the ultrasonic device 100 along bond lines 420 and at epoxy dots 330 on the tips of the electromechanically active devices 120. The bond lines 420 may create borders for ultrasonic transducer cells 310, which may each be covered by a membrane section 410 that may be mechanically isolated from other membrane sections 410 while still being part of the membrane 400.

Figure 11A:
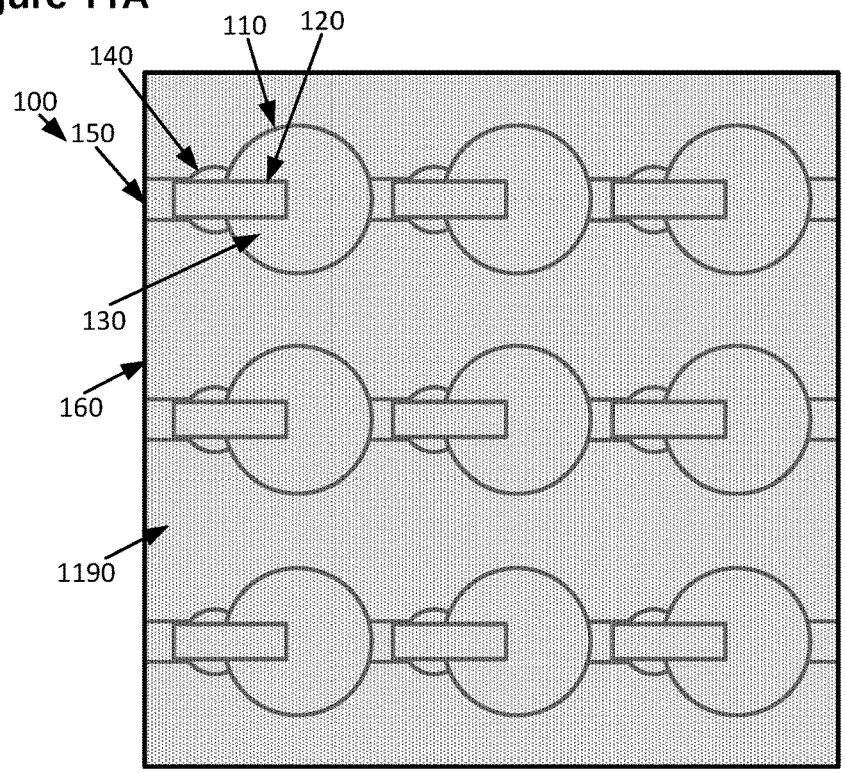
FIG. 11A shows an example ultrasonic device according to an implementation of the disclosed subject matter.

FIG. 11A shows an example ultrasonic device according to an implementation of the disclosed subject matter. The electromechanically active devices 120 of the ultrasonic device 100 may be cleaned using solvents and acids. For example, acetone, methanol, and isopropanol may be used to clean the electromechanically active devices 120. Chromic acid, hydrochloric acid, and various other materials which may promote adhesion may also be used. A photoresist 1190 may be applied to the ultrasonic device 100. The photoresist 1190 may be, for example, for example, a dry film photoresist such as a Kapton polyimide film, liquid photoresist, (BCB) photoresist, or polyimide photoresist, or other photo-definable material, and may be a positive or negative photoresist. The photoresist 1190 may be, for example, a thin dry film which may be applied to the top of the ultrasonic device 100, and may cover, and be in contact with, the electromechanically active devices 120 and the substrate 160. The dry film may cover, and may be suspended over or pressed into, the main cavities 130, secondary cavities 140, and channels 150. The dry film may be attached to the ultrasonic device 100 in any suitable manner. For example, the dry film may be ironed on to the ultrasonic device 100 using a hot iron set to an appropriate temperature, or the dry film may be applied and attached to the ultrasonic device 100 using any suitable laminating device. The photoresist 1190 may be, for example, a liquid photoresist, including, for example, liquid BCB photoresist or a liquid polyimide photoresist. A liquid photoresist may be applied to the ultrasonic device 100 in any suitable manner. For example, a liquid photoresist may be applied through electrodeposition on the ultrasonic device 100 or through spin coating of the ultrasonic device 100.

Figure 11B:
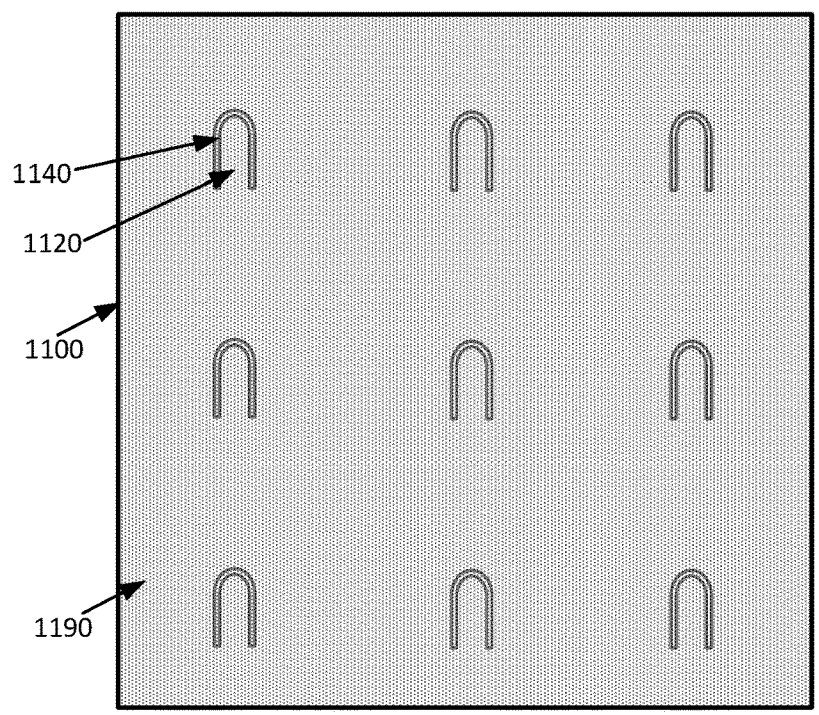
FIG. 11B shows an example laminate material according to an implementation of the disclosed subject matter.

FIG. 11B shows an example laminate material according to an implementation of the disclosed subject matter. A laminate material 1100 may be a laminate made by bonding a layer of an electrically active material, such as a piezoceramic material, to a layer of an electrically passive, conductive, material, such as metal, including, for example, aluminum, stainless steel, or brass. The layers may be bonded in any suitable manner, for example, using any suitable adhesive or epoxy, or any other bonding technique or material. Flexures 1120 may be electromechanically active devices created in the laminate material 1100 through removal of portions of the laminate material 1100 in any suitable shape, such as U shape, resulting in gaps 1140 between flexures 1120 and the rest of the laminate material 1100. Each of the gaps 1140 define a boundary for each of the flexures 1120. The flexures 1120 may remain connected to the rest of the laminate material 1100 while having free ends that can move independently of the rest of the laminate material 1100. The gap 1140 may be the result of the removal of portions of the laminate material 1100 through the entire thickness of the laminate material 1100, and may be created in any suitable manner, such as, for example, through laser ablation, with a CNC mill, or through the use of any other suitable device for removing portions of the laminate material 1100.

The laminate material 1100 may be cleaned using solvents and acids. For example, acetone, methanol, and isopropanol may be used to clean the laminate material 1100. Chromic acid, hydrochloric acid, and various other materials which may promote adhesion may also be used. The photoresist 1190 may be applied to the laminate material 1100. The photoresist 1190 may be, for example, for example, a dry film photoresist such as a Kapton polyimide film, liquid photoresist, (BCB) photoresist, or polyimide photoresist, or other photo-definable material, and may be a positive or negative photoresist. The photoresist 1190 may be a thin dry film which may be applied to the top of the laminate material 1100, and may cover, and be in contact with, laminate material 1100 and the flexures 1120 within the laminate material 1100. The dry film may cover, and may be suspended over the gaps 1140. The dry film may be attached to the laminate material 1100 in any suitable manner. For example, the dry film may be ironed on to the laminate material 1100 using a hot iron set to an appropriate temperature, or the dry film may be applied and attached to the laminate material 1100 using any suitable laminating device. The photoresist 1190 may be, for example, a liquid photoresist, including, for example, liquid BCB photoresist or a liquid polyimide photoresist. A liquid photoresist may be applied to the laminate material 1100 in any suitable manner. For example, a liquid photoresist may be applied through electrodeposition on the laminate material 1100 or through spin coating of the laminate material 1100. The liquid photoresist may coat the surface of the laminate material 1100, and may or may not fill the gaps 1140, depending, for example, on the viscosity, thickness, and adhesion of the liquid photoresist.

Figure 11C:
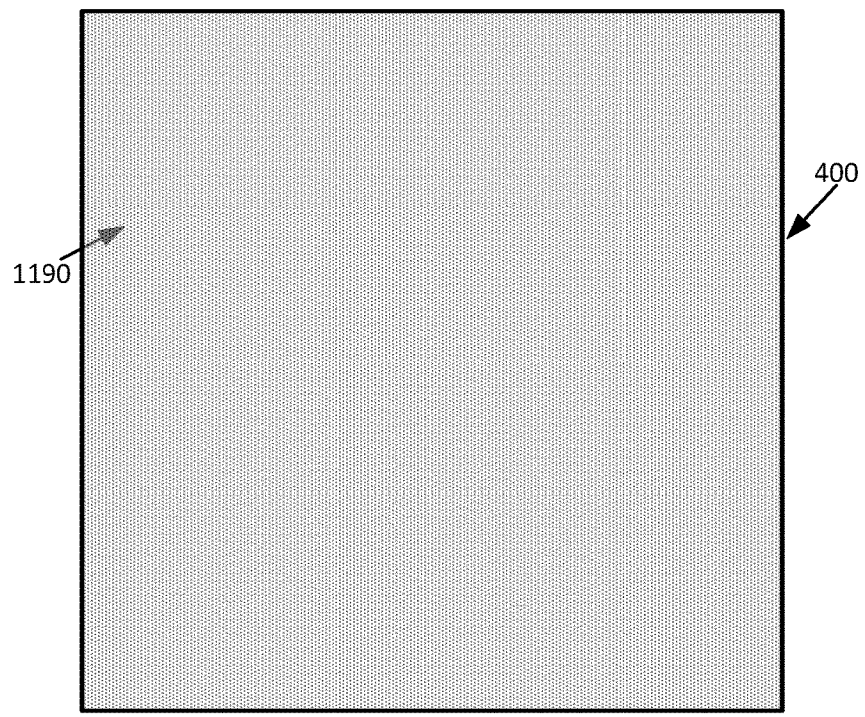
FIG. 11C shows an example membrane according to an implementation of the disclosed subject matter.

FIG. 11C shows an example membrane according to an implementation of the disclosed subject matter. The membrane 400 may be cleaned in any suitable manner. The photoresist 1190 may be applied to the membrane 400. The photoresist 1190 may be, for example, for example, a dry film photoresist such as a Kapton polyimide film, liquid photoresist, (BCB) photoresist, or polyimide photoresist, or other photo-definable material, and may be a positive or negative photoresist. The photoresist 1190 may be a thin dry film which may be applied to a surface of the membrane 400, and may cover, and be in contact with, the surface of the membrane 400. The dry film may be attached to the membrane 400 in any suitable manner. For example, the dry film may be ironed on to the membrane 400 using a hot iron set to an appropriate temperature, or the dry film may be applied and attached to the membrane 400 using any suitable laminating device. The photoresist 1190 may be, for example, a liquid photoresist, including, for example, liquid BCB photoresist or a liquid polyimide photoresist. A liquid photoresist may be applied to the membrane 400 in any suitable manner. For example, a liquid photoresist may be applied through electrodeposition on the membrane 400 or through spin coating of the membrane 400.

Figure 12A:
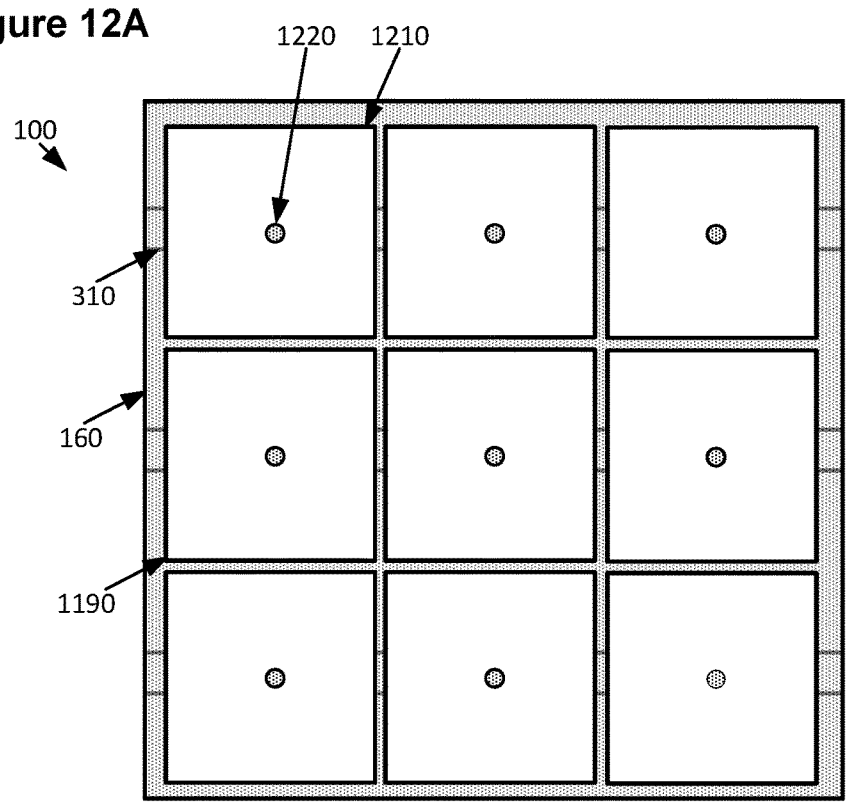
FIG. 12A shows an example ultrasonic device according to an implementation of the disclosed subject matter.

FIG. 12A shows an example ultrasonic device according to an implementation of the disclosed subject matter. Covering 1210 may be placed over the ultrasonic device 100, on top of the photoresist 1190, which may be a negative photoresist. The covering 1210 may be separate pieces, or may be a single unit of connected pieces, for example, using material that projects above the pieces so that UV light may still reach the portions photoresist 1190 that are not meant to be covered by the covering 1210. The covering 1210 may cover the photoresist 1190 so that the uncovered portions of the photoresist 1190 form the outlines of the transducer cells 310. The covering 1210 may include cut out dots 1220 which may be positioned so that a dot of photoresist 1190 is uncovered on the tip of each electromechanically active device 120. If the photoresist is a positive photoresist, the covering used may be the inverse of the covering 1210. For example, the covering used with a positive photoresist may cover the outlines of the transducer cells 310 and dots on the tips of the electromechanically active devices 120.

Figure 12B:
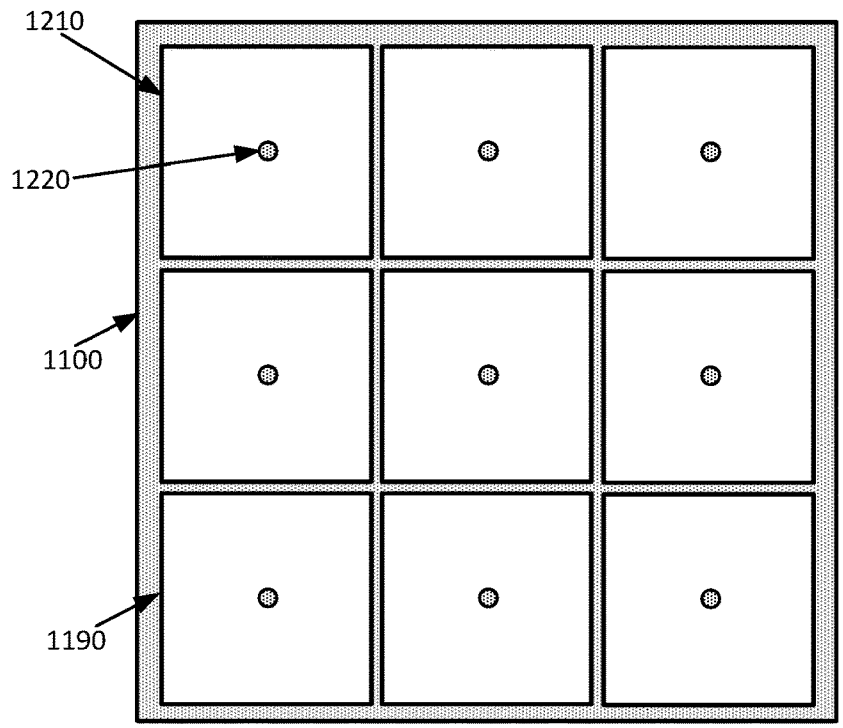
FIG. 12B shows an example laminate material according to an implementation of the disclosed subject matter.

FIG. 12B shows an example laminate material according to an implementation of the disclosed subject matter. The covering 1210 may be placed over the laminate material 1100, on top of the photoresist 1190, which may be a negative photoresist. The covering 1210 may be separate pieces, or may be a single unit of connected pieces, for example, using material that projects above the pieces so that UV light may still reach the portions of the photoresist 1190 that are not meant to be covered by the covering 1210. The covering 1210 may cover the photoresist 1190 so that the uncovered portions of the photoresist 1190 form the outlines of the transducer cells 310 on the laminate material 1100. The covering 1210 may include cut out dots 1220 which may be positioned so that a dot of photoresist 1190 is uncovered on the tip of each flexure 1120. If the photoresist is a positive photoresist, the covering used may be the inverse of the covering 1210. For example, the covering used with a positive photoresist may cover the outlines of the transducer cells 310 and dots on the tips of the flexures 1120.

Figure 12C:
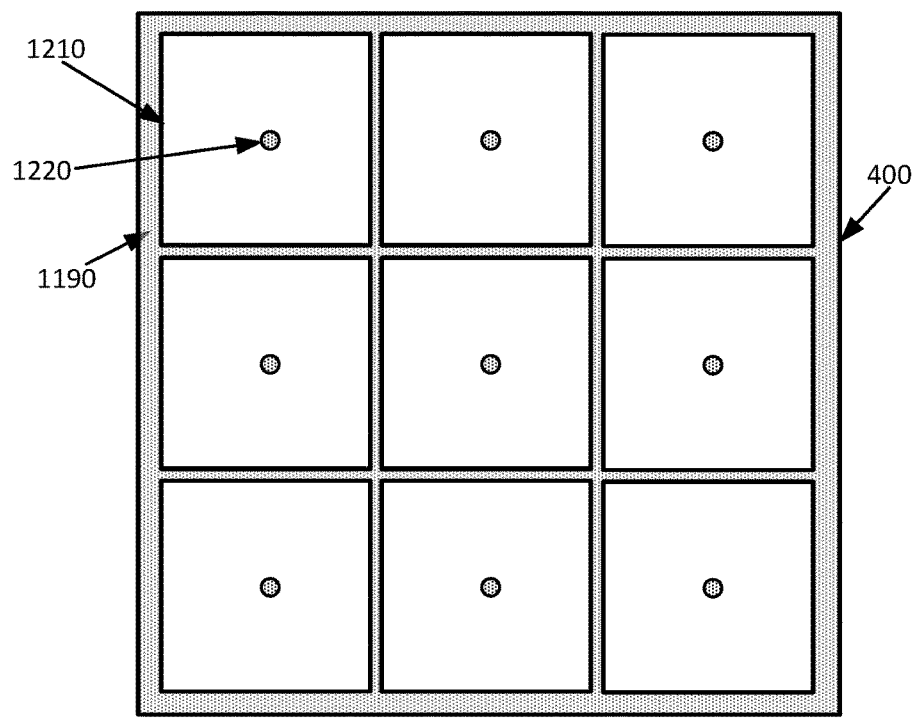
FIG. 12C shows an example membrane according to an implementation of the disclosed subject matter.

FIG. 12C shows an example membrane according to an implementation of the disclosed subject matter. The covering 1210 may be placed over the membrane 400, on top of the photoresist 1190, which may be a negative photoresist. The covering 1210 may be separate pieces, or may be a single unit of connected pieces, for example, using material that projects above the pieces so that UV light may still reach the portions of the photoresist 1190 that are not meant to be covered by the covering 1210. The covering 1210 may cover the photoresist 1190 so that the uncovered portions of the photoresist 1190 form the outlines of the transducer cells 310 on the membrane 400. The covering 1210 may include cut out dots 1220 which may be positioned so that a dot of photoresist 1190 is uncovered on locations of the membrane 400 that may align with the tips of electromechanically active devices 120 or flexures 1120 when the membrane 400 is placed over the ultrasonic device 100 or the laminate material 1100. If the photoresist is a positive photoresist, the covering used may be the inverse of the covering 1210. For example, the covering used with a positive photoresist may cover the outlines of the transducer cells 310 and the locations of the membrane 400 that may align with the tips of electromechanically active devices 120 or flexures 1120.

Figure 13A:
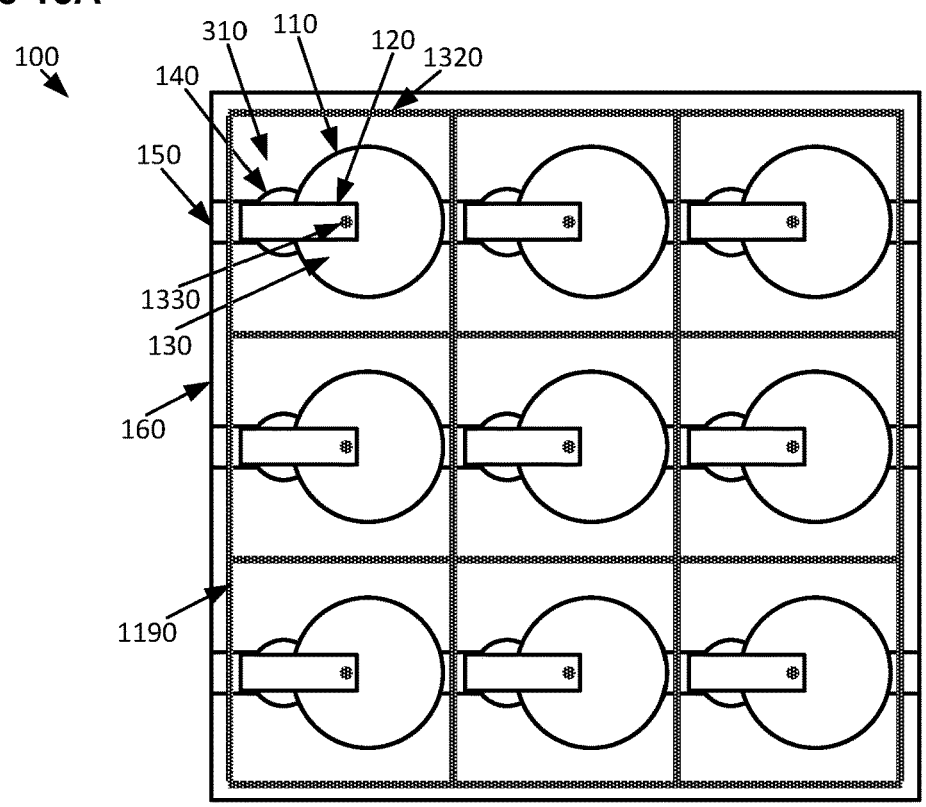
FIG. 13A shows an example ultrasonic device according to an implementation of the disclosed subject matter.

FIG. 13A shows an example ultrasonic device according to an implementation of the disclosed subject matter. The portions of the photoresist 1190 not covered by the covering 1210 may be exposed to light source, such as UV light, for any suitable length of time, after which developer may be used to remove the uncovered portions of the photoresist 1190 when the photoresist 1190 is a positive photoresist or the covered portions of the photoresist 1190 when the photoresist 1190 is a negative photoresist. The portions of the photoresist 1190 which remain on the ultrasonic device 100 may form transducer cell boundaries 1320 and photoresist dots 1330. The transducer cell boundaries 1320 may be the outlines of the transducer cells 310. The photoresist dots 1330 may be located on the tips of the electromechanically active devices 120. The photoresist 1190 may protrude 15-20 microns from the surface of the substrate 160 and the electromechanically active devices 120 of the ultrasonic device 100.

Figure 13B:
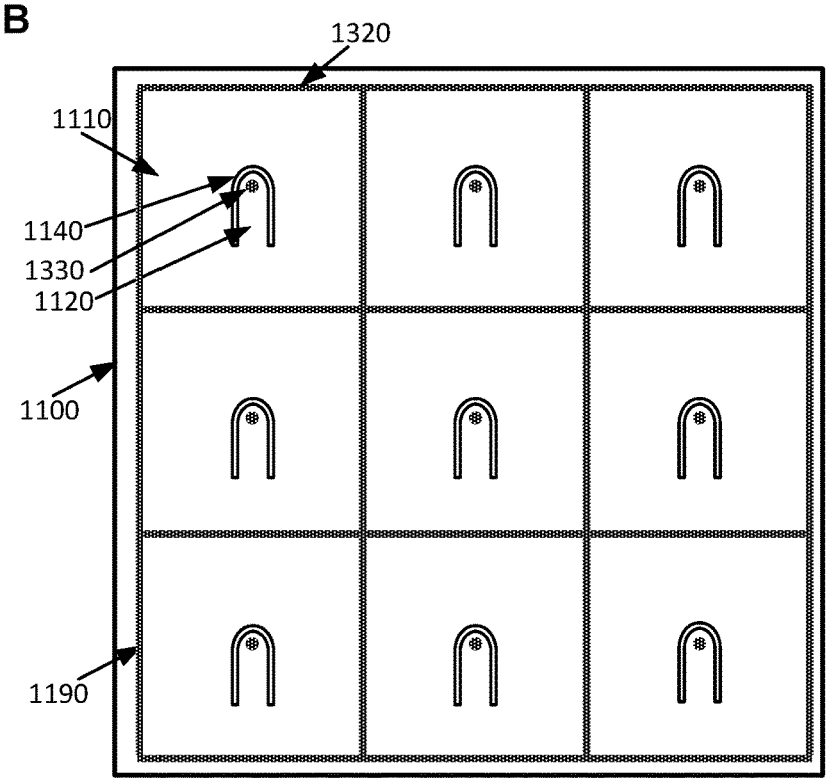
FIG. 13B shows an example laminate material according to an implementation of the disclosed subject matter.

FIG. 13B shows an example laminate material according to an implementation of the disclosed subject matter. The portions of the photoresist 1190 not covered by the covering 1210 may be exposed to light source, such as UV light, for any suitable length of time, after which developer may be used to remove the uncovered portions of the photoresist 1190 when the photoresist 1190 is a positive photoresist or the covered portions of the photoresist 1190 when the photoresist 1190 is a negative photoresist. The portions of the photoresist 1190 which remain on the laminate material 1100 may form transducer cell boundaries 1320 and photoresist dots 1330. The transducer cell boundaries 1320 may be the outlines of the transducer cells 310. The photoresist dots 1330 may be located on the tips of the flexures 1120. The photoresist 1190 may protrude 15 to 20 microns from the surface of the laminate material 1100 and the flexures 1120.

Figure 13C:
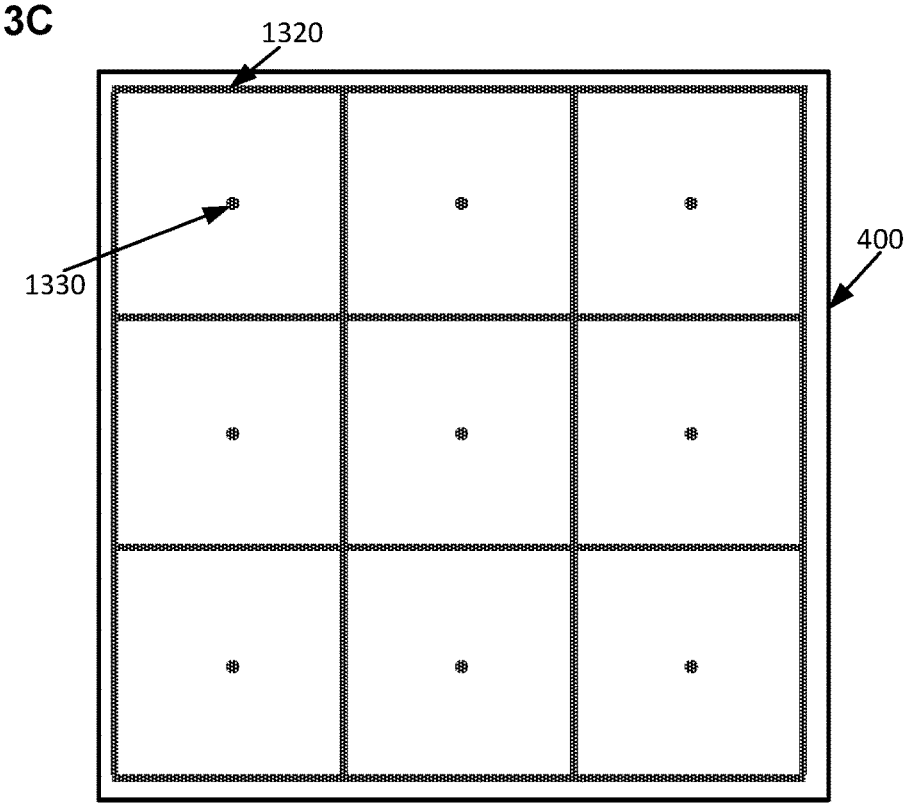
FIG. 13C shows an example membrane according to an implementation of the disclosed subject matter.

FIG. 13C shows an example membrane according to an implementation of the disclosed subject matter. The portions of the photoresist 1190 not covered by the covering 1210 may be exposed to light source, such as UV light, for any suitable length of time, after which developer may be used to remove the uncovered portions of the photoresist 1190 when the photoresist 1190 is a positive photoresist or the covered portions of the photoresist 1190 when the photoresist 1190 is a negative photoresist. The portions of the photoresist 1190 which remain on the membrane 400 may form transducer cell boundaries 1320 and photoresist dots 1330. The transducer cell boundaries 1320 may be the outlines of the transducer cells 310. The locations of the photoresist dots 1330 on the membrane 400 may align with the tips of electromechanically active devices 120 or flexures 1120 when the membrane 400 is placed over the ultrasonic device 100 or the laminate material 1100. The photoresist 1190 may protrude 15 to 20 microns from the surface of the membrane 400.

Figure 14:
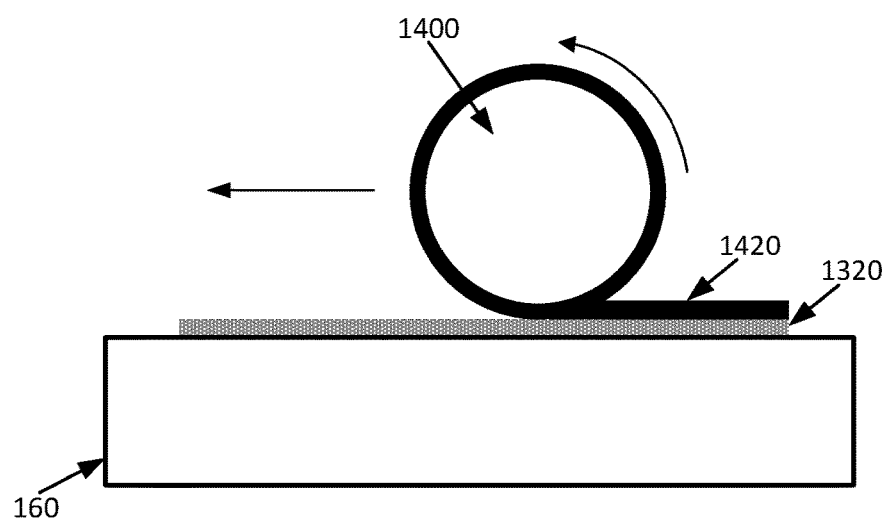
FIG. 14 shows an example application of epoxy according to an implementation of the disclosed subject matter.

FIG. 14 shows an example application of epoxy according to an implementation of the disclosed subject matter. Epoxy 1420 may be applied on top of the portions of photoresist 1190 that remain on the ultrasonic device 100, laminate material 1100, or membrane 400. The epoxy 1420 may be applied in any suitable manner. For example, a roller 1400 may be coated with the epoxy 1420. The roller may be rolled over the ultrasonic device 100 with the bottom of the roller 1400 at the same height as the top of the photoresist 1190, for example, 15 to 20 microns above the surface of the substrate 160. The roller may contact, and apply the epoxy 1420 to, the photoresist 1190, for example, at the transducer cell boundaries 1320 and the photoresist dots 1330, as the roller 1400 rotates and moves over the surface of the ultrasonic device 100. The roller 1400 may not contact, and may not apply the epoxy 1420 to, the substrate 160 or the electromechanically active devices 120 of the ultrasonic device 100, or the laminate material 1100 and the flexures 1120, or the surface of the membrane 400. The epoxy 1420 may be applied only to the photoresist 1190. The application of the epoxy 1420 to the photoresist 1190 may form the bond lines 320 and epoxy dots 330 which may be used to bond the membrane 400 to the ultrasonic device 100 or laminate material 1120, forming the transducer cells 310 and membrane sections 410, and bonding the tips of the electromechanically active devices 120 or flexures 1120 to the appropriate locations on the membrane 400.

Figure 15:
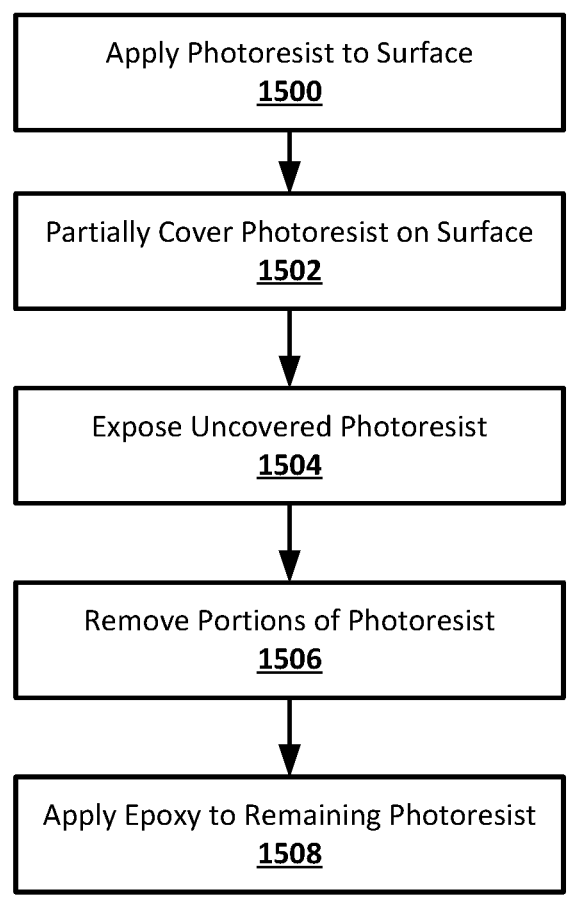
FIG. 15 shows an example process suitable for membrane bonding according to an implementation of the disclosed subject matter.

FIG. 15 shows an example process suitable for membrane bonding according to an implementation of the disclosed subject matter. At 1500, photoresist may be applied to a surface. For example, the photoresist 1190 may be applied to the surface of the ultrasonic device 100, the laminate material 1100, or the membrane 400 in any suitable manner. A dry film may be applied, for example, using a hot iron or a suitable laminating device. A liquid photoresist may be applied, for example, using electrodeposition or spin coating.

At 1502, the photoresist may be partially covered. For example, the covering 1210 may be used to cover portions of the photoresist 1190 that has been applied to the surface of the ultrasonic device 100, the laminate material 1100, or the membrane 400. The portions of the photoresist 1190 that are covered may be based on whether the photoresist 1190 is a positive photoresist or a negative photoresist. For example, if the photoresist 1190 is a negative photoresist, the covering 1210 may cover the portions of the photoresist 1190 that are to be removed, while leaving uncovered the portions of the photoresist that may form the transducer cell boundaries 1320 and the photoresist dots 1330. If the photoresist 1190 is a positive photoresist, a covering may cover the portions of the photoresist 1190 that may form the transducer cell boundaries 1320 and the photoresist dots 1330, while leaving uncovered the portions of the photoresist 1190 that are to be removed.

At 1504, the photoresist may be exposed. For example, the uncovered portions of the photoresist 1190 may be exposed to any suitable light source that may emit any suitable wavelengths of UV light. The uncovered portions of the photoresist 1190 may be exposed to the light source for any suitable length of time.

At 1506, portions of the photoresist may be removed. For example, if the photoresist 1190 is a positive photoresist, a suitable developer liquid may be used to remove the portions of the photoresist 1190 that were not covered, for example, by the covering 1210, while the photoresist 1190 was exposed to the light source. The uncovered portions of the photoresist 1190 may have become soluble to the developer liquid due to exposure to the light source, allowing the developer liquid to be used to remove the uncovered portions of the photoresist 1190 from the surface of, for example, the ultrasonic device 100, the laminate material 1100, or the membrane 400. If the photoresist 1190 is a negative photoresist, a suitable developer liquid may be used to remove the portions of the photoresist 1190 that were covered while the photoresist 1190 was exposed to the light source. The covered portions of the photoresist 1190 may have already been soluble to the developer liquid, while the uncovered portions may have become insoluble to the developer liquid due to exposure to the light source, allowing the developer liquid to be used to remove the covered portions of the photoresist 1190 from the surface of, for example, the ultrasonic device 100, the laminate material 1100, or the membrane 400. The remaining portions of the photoresist 1190 may form the transducer cell boundaries 1320 and the photoresist dots 1330.

At 1508, epoxy may be applied to the remaining photoresist. For example, the epoxy 1420, or any other suitable bonding agent, may be applied to the portions of the photoresist 1190 that remain on the ultrasonic device 100, the laminate material 1100, or the membrane 400 after the removal of other portions of the photoresist 1190 by the developer liquid. The epoxy 1420 may be applied in any suitable manner, for example, using a stencil and squeegee techniques, inkjet printing techniques, or a roller, such as the roller 1400. The roller 1400 may, for example, be rolled over the top of surface of the ultrasonic device 100, the laminate material 1100, or the membrane 400 with the bottom of the roller 1400 at the same height, or rolling in the same plane, as the top of the remaining portion of the photoresist 1190. The top of the remaining portion of the photoresist 1190 may be 15-20 microns above the surface of the ultrasonic device 100, the laminate material 1100, or the membrane 400. The epoxy 1420 applied to the remaining portion of the photoresist 1190 may form the bond lines 320, outlining the transducer cells 310, and the epoxy dots 330. The membrane 400 may then be placed on the surface of the ultrasonic device 100 or the laminate material 1100, and may be bonded with the epoxy 1420, which may be on just the membrane 400, just the ultrasonic device 100 or the laminate material 1100, or may be on both.

The foregoing description, for purpose of explanation, has been described with reference to specific embodiments. However, the illustrative discussions above are not intended to be exhaustive or to limit embodiments of the disclosed subject matter to the precise forms disclosed. Many modifications and variations are possible in view of the above teachings. The embodiments were chosen and described in order to explain the principles of embodiments of the disclosed subject matter and their practical applications, to thereby enable others skilled in the art to utilize those embodiments as well as various embodiments with various modifications as may be suited to the particular use contemplated.

The invention claimed is:

1. A method comprising:
    applying a photoresist to a surface;
    covering a first portion of the photoresist on the surface;
    exposing a second portion of the photoresist that was not covered to a light source;
    removing either the first portion of the photoresist or the second portion of the photoresist to create a remaining portion of the photoresist on the surface; and
    applying a bonding agent to the remaining portion of the photoresist on the surface.

2. The method of claim 1, further comprising:
    placing a membrane on the surface such that the membrane is in contact with the bonding agent.

3. The method of claim 2, further comprising:
    applying pressure to the membrane.

4. The method of claim 2, wherein the surface is a surface of either an ultrasonic device or a laminate material.

5. The method of claim 1, wherein applying the bonding agent to the surface comprises:
    applying the bonding agent to a roller; and
    rolling the roller across a top of the remaining portion of the photoresist on the surface.

6. The method of claim 1, wherein the second portion of the photoresist is removed when the photoresist is a positive photoresist and wherein the first portion of the photoresist is removed when the photoresist is a negative photoresist.

7. The method of claim 1, wherein the bonding agent is an epoxy.

8. A method comprising:
    applying a photoresist to a surface;
    covering a first portion of the photoresist on the surface;
    exposing a second portion of the photoresist that was not covered to a light source;
    removing the first portion of the photoresist to create a remaining portion of the photoresist on the surface, the remaining portion of the photoresist comprising the second portion of the photoresist; and
    applying an epoxy to the remaining portion of the photoresist on the surface, wherein the epoxy forms epoxy lines on the surface.

9. The method of claim 8, further comprising:
    placing a membrane on the ultrasonic device such that the membrane is in contact with the epoxy.

10. The method of claim 9, further comprising:
    applying pressure to the membrane.

11. The method of claim 9, further comprising before placing the membrane on the surface, preparing or texturing at least one surface of the membrane, and wherein the at least one prepared or textured surface is placed in contact with the epoxy of the surface when the membrane is placed on the surface.

12. The method of claim 8, wherein the epoxy lines form bond lines after the epoxy has cured.

13. The method of claim 8, where the first portion of the photoresist is removed using a developer liquid for the photoresist.

14. A method comprising:
    applying a photoresist to a surface;
    covering a first portion of the photoresist on the surface;
    exposing a second portion of the photoresist that was not covered to a light source, wherein the first portion of the photoresist;
    removing the second portion of the photoresist to create a remaining portion of the photoresist on the surface, the remaining portion of the photoresist comprising the first portion of the photoresist; and
    applying an epoxy to the remaining portion of the photoresist on the surface, wherein the epoxy forms epoxy lines on the surface.

15. The method of claim 14, further comprising:
    placing a membrane on the surface such that the membrane is in contact with the epoxy.

16. The method of claim 15, further comprising:
    applying pressure to the membrane.

17. The method of claim 14, wherein the epoxy lines form bond lines after the epoxy has cured.

18. The method of claim 14, further comprising before placing the membrane on the surface, preparing or texturing at least one surface of the membrane, and wherein the at least one prepared or textured surface is placed in contact with the epoxy of the surface when the membrane is placed on the surface.

19. The method of claim 14, where the first portion of the photoresist is removed using a developer liquid for the photoresist.

20. The method of claim 14, wherein the surface is a surface of either an ultrasonic device or laminate material.

* * * * *